United States Patent

Rothenberg

[11] Patent Number: 5,933,056
[45] Date of Patent: Aug. 3, 1999

[54] SINGLE POLE CURRENT MODE COMMON-MODE FEEDBACK CIRCUIT

[75] Inventor: Bret C. Rothenberg, Los Altos, Calif.

[73] Assignee: Exar Corporation, Fremont, Calif.

[21] Appl. No.: 08/892,712

[22] Filed: Jul. 15, 1997

[51] Int. Cl.[6] .................................................... H03F 3/45
[52] U.S. Cl. ............................ 330/258; 330/252; 330/253
[58] Field of Search .................................... 330/258, 253, 330/261, 254, 252, 259

[56] References Cited

U.S. PATENT DOCUMENTS 3,786,362  1/1974  Marsh et al. ............................ 330/261
4,720,686  1/1988  Westwick ............................... 330/258

Primary Examiner—Robert Pascal
Assistant Examiner—Patricia Nguyen
Attorney, Agent, or Firm—Townsend and Townsend and Crew LLP

[57] ABSTRACT

A CMFB circuit that contains only one voltage amplifier in the loop, and is therefore immune to multi-pole stability problems. This is accomplished by providing feedback in the form of current which sums with a constant node current of the differential voltage amplifier. This control current source is created with two transistors, one controlled by the desired, common-mode voltage level, and another connected to the actual, measured common-mode output level.

11 Claims, 2 Drawing Sheets

SINGLE POLE CURRENT MODE COMMON-MODE FEEDBACK CIRCUIT

BACKGROUND OF THE INVENTION

The present invention relates to common-mode feedback (CMFB) circuits used in differential amplifiers, and in particular to such circuits for driving an unknown capacitive load.

In some applications it is desirable to have an amplifier that is capable of driving any capacitive load. Since this load is not known in advance, it is often difficult to construct a differential amplifier composed of a differential feedback loop and a common-mode feedback loop, both which are stable with any load. Therefore, it is desirable to have a configuration where the dominant pole is set only by the output load capacitance for both the common-mode and differential feedback loops. In order to have a good power supply rejection ratio (PSRR) it is desirable to have a fully differential buffer structure. To stabilize the common-mode output level of a differential buffer, a common-mode feedback (CMFB) circuit may be used. Typically, this CMFB loop contains at least two voltage amplifiers, making the CMFB loop a multi-stage/multi-pole type design. This results in a potential stability problem depending on the load conditions of the buffer.

SUMMARY OF THE INVENTION

The present invention discloses a CMFB circuit that contains only one voltage amplifier in the common-mode loop, and is therefore immune to multi-pole stability problems. This is accomplished by providing feedback in the form of current which sums with the current of the voltage amplifier input and output transistors where they are connected to their own common current source. This current source control uses two transistors, one controlled by the desired, common-mode voltage level, and another connected to the actual, measured common-mode output level.

In one embodiment, a newly created common-mode point is provided in order to avoid having the common-mode control loop current affect the transconductance of the differential loop of the amplifier.

For further understanding of the nature and advantages of the invention, reference should be made to the following description taken in conjunction with the accompanying drawings.

DESCRIPTION OF THE PREFERRED EMBODIMENT

Figure 1:
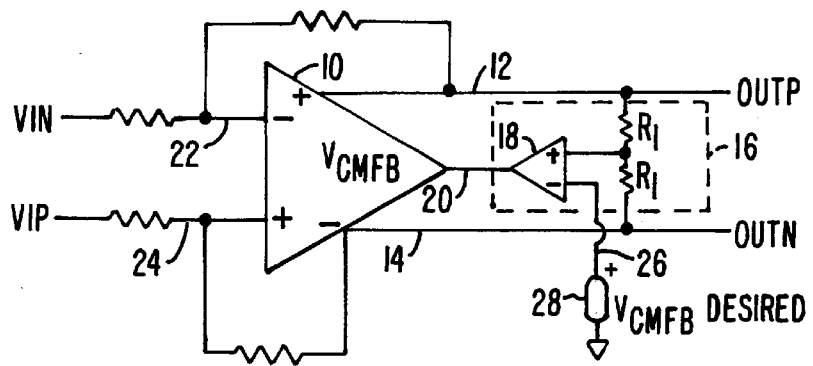
FIG. 1 is a block diagram of a prior art CMFB circuit.

FIG. 1 illustrates a differential amplifier 10 which provides a positive output 12 and a negative output 14. (A differential amplifier typically requires a circuit to set the amplifiers common-mode output level. The "common-mode" is the average of the two voltages, while "differential" refers to the difference between the two voltages.) A common-mode measuring circuit 16 includes a resistor divider connected to an amplifier 18. Amplifier 18 is connected back into a control input 20 of amplifier 10.

Amplifier 10 has a negative input 22 and a positive input 24. A desired common-mode voltage is provided at a node 26 by a reference circuit 28.

The circuit in FIG. 1 senses the common-mode output level of amplifier 10 through the resistor divider, and compares it to the desired common-mode output level on line 26. A control signal is then generated on line 20 that adjusts the common-mode output level. This common-mode control loop is a negative feedback control loop. Therefore, in steady-state the output common-mode level should equal the desired common-mode level.

Figure 2:
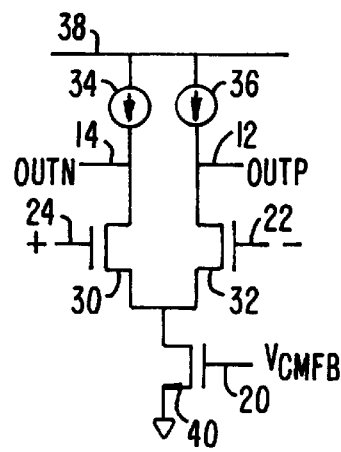
FIG. 2 is a diagram of one prior art circuit embodiment of amplifier 10 of FIG. 1.

FIG. 2 illustrates one possible embodiment of amplifier 10 of FIG. 1 in more detail. As can be seen, the amplifier includes input transistors 30 and 32, each of which receives current from current sources 34 and 36, respectively. These current sources are connected to a voltage reference 38. Feedback control line 20 is connected to the gate of a control transistor 40 which shifts the common-mode output voltage level of the amplifier to put it at the desired common-mode level.

The gate of MOS transistor 40 is controlled with a voltage. The amplifier has voltage gain from this gate to the output.

Referring back to FIG. 1, as can be seen, there is a pole associated with amplifier 10, and a second pole associated with feedback amplifier 18, resulting in a multi-pole common-mode loop with resultant stability concerns.

Figure 3:
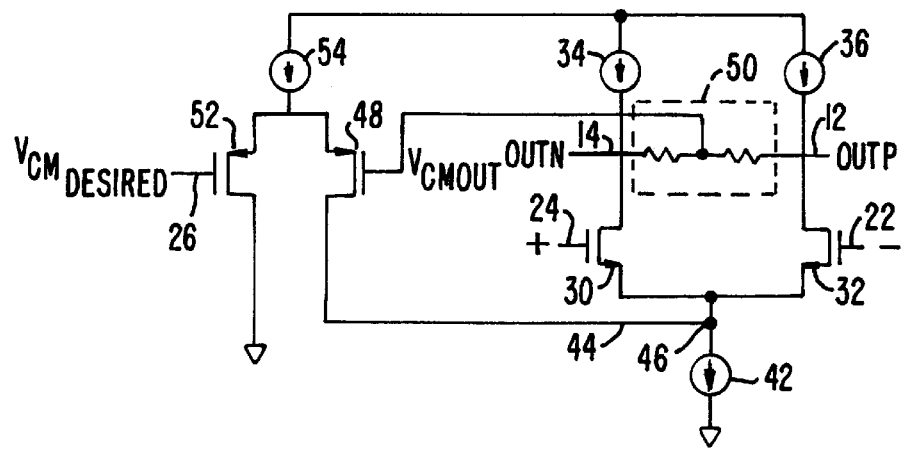
FIG. 3 is a diagram of a first embodiment of the present invention.

FIG. 3 illustrates one embodiment of the present invention. The components in common with FIG. 2 have been labeled in the same manner, including input transistors 30 and 32. However, instead of the feedback control transistor 40 of FIG. 2, a current source 42 is used, with a feedback line 44 providing a control current at a summing node 46. A control current on line 44 is provided through a transistor 48. Transistor 48 has its gate coupled to a common-mode signal from a common-mode measuring circuit 50. Circuit 50 may simply be a resistor divider, or may be other mechanisms for measuring the common-mode output signal. Transistor 48 is a PMOS transistor, which is connected to another PMOS transistor 52 and a current source 54. The gate of transistor 52 is applied to a desired common-mode voltage on line 26.

As can be seen, the circuit of FIG. 3 thus replaces the control voltage with a wired current input. The result is that the complete, common-mode amplifier loop consists of only one stage. A conventional differential pair is used to provide a control current output on line 44. This control current is fed to the common-mode point 46 of the amplifier. As a result there is voltage gain from the input of the differential pair 52 and 48 to the output. There is no voltage gain from the input to any other node. Therefore, this loop consists of only one voltage amplifier.

Figure 4:
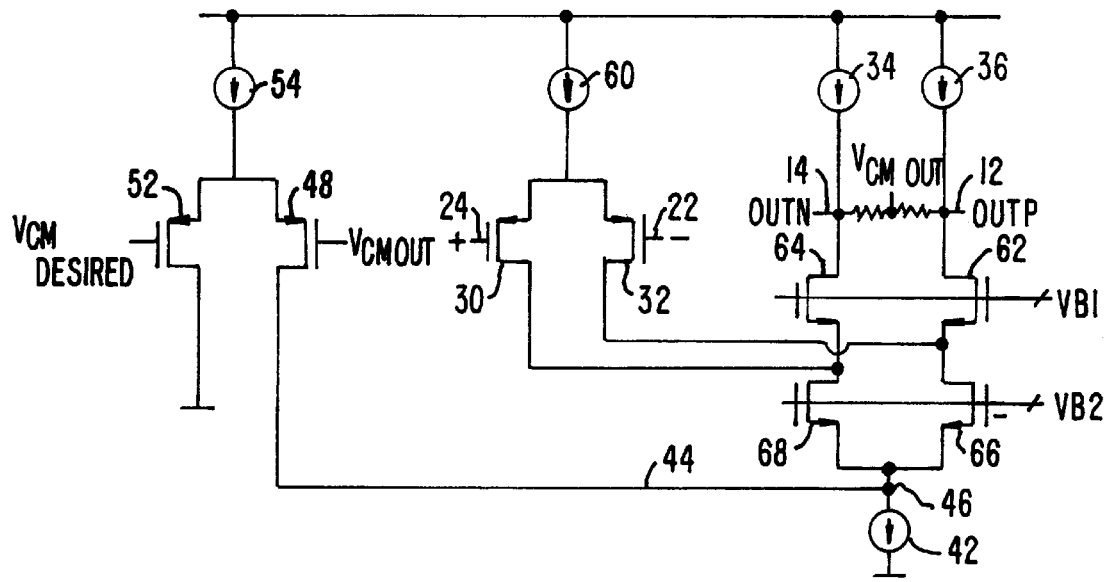
FIG. 4 is a diagram of a second embodiment of the present invention adding another CMFB summing point.

FIG. 4 illustrates an alternate embodiment of the present invention. This embodiment addresses the one disadvantage of FIG. 3, in that the control current feedback can affect the transconductance of transistors 30 and 32 in the differential loop in FIG. 3, and, therefore, affect the differential loop of the amplifier. This is avoided in the FIG. 4 embodiment by isolating the common-mode feedback circuitry from the amplifier input transistors. In particular, input transistors 30 and 32 are instead connected to a constant single current source 60. The differential output signals on lines 12 and 14 are provided from transistors 30 and 32 as before. Intermediate transistors 62 and 64 controlled by a voltage reference VB1 form a cascode stage for current buffering. Transistors 66, 68 having their gates connected to second voltage reference VB2 form a current source for the differential amplifier loop and form a current buffering stage for the common-mode loop. This circuit has the benefit of isolating the transconductance of input transistors 30 and 32 from variations on the current on line 44 to node 46.

Figure 5:
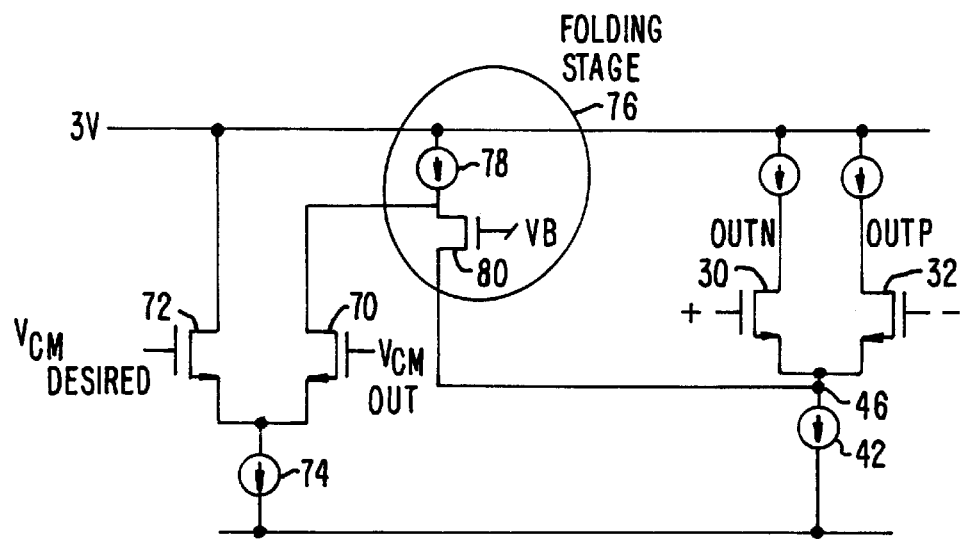
FIG. 5 is another embodiment of the present invention adding an optional folding stage to allow the use of NMOS transistors in the embodiments of FIG. 3 or 4.

FIG. 5 illustrates an enhancement of the present invention in which PMOS feedback transistors 48 and 52 are replaced with NMOS transistors 70 and 72. In this instance, a current source 74 is used. A folding stage 76 is added. Without the folding stage, transistor 70's drain would not be at a high enough voltage to operate in saturation. Transistor 70 is used to control current as before. However, transistor 80 operates as a current buffer holding the drain of transistor 70 at a high voltage and providing an output current compatible with the source voltage of devices 30 and 32. The folding stage 76 separates the voltage compliance range of the CMFB differential pairs 70, 72 from the voltage input point 46, the current summing junction.

As will be understood by those skilled in the art, the present invention may be embodied in other specific forms not departing from the spirit or sense of characteristics thereof. Accordingly, the foregoing description is intended to be illustrative, but not limiting, of the scope of the invention which is set forth in the following claims.

What is claimed is:

1. A common-mode voltage amplifier loop comprising:
   a differential amplifier containing a common-mode control node, said differential amplifier including
      an amplifier positive input transistor,
      an amplifier negative input transistor, a first current source coupled to said input transistors, and a current input to control a common-mode output level; a common-mode measuring circuit; and a common-mode control circuit, coupled between said common-mode measuring circuit and said common-mode control node; for providing a common-mode control current to said common-mode control node.

2. The voltage amplifier of claim 1 wherein said common-mode control circuit comprises:
   a second, constant current source coupled to said voltage supply;
   a first common-mode control transistor coupled to said second, common-mode control current source and having a control input coupled to a desired common-mode voltage reference; and
   a second common-mode control transistor having a first node coupled to said second, constant current source and having a control input coupled to a common-mode output of said common-mode measuring circuit, and having a current output node coupled to a current common-mode control node between said first current source and said input transistors for setting the common-mode output voltage of said input transistors to a control voltage applied as a desired common-mode reference.

3. A common-mode voltage amplifier loop comprising:
   a differential amplifier containing a common-mode control node;
   a common-mode measuring circuit comprising a resistor interpolator; and a common-mode control circuit coupled between said common-mode measuring circuit and said common-mode control node, for providing a common-mode control current to said common-mode control node.

4. A differential voltage amplifier comprising:
   a voltage supply;
   a differential amplifier positive input transistor;
   a differential amplifier negative input transistor;
   a first constant current source coupled to said input transistors;
   a common-mode measuring circuit coupled between a positive and negative output of said voltage amplifier;
   a second, common-mode constant current source coupled to said voltage supply;
   a first common-mode control transistor coupled to said second, common-mode constant current source and having a control input coupled to a desired common-mode voltage reference; and
   a second common-mode control transistor having a first node coupled to said second, common-mode constant current source and having a control input coupled to a common-mode output of said common-mode measuring circuit, and having a second node coupled to a current input control node between said first constant current source and said differential amplifier input transistors for setting a common-mode output voltage of the differential amplifier to a control voltage applied as the desired common-mode reference.

5. The amplifier of claim 4 wherein said common-mode measuring circuit comprises a resistor interpolator.

6. The amplifier of claim 4 wherein said first and second common-mode control transistors are the opposite type as said differential amplifier input transistors.

7. The amplifier of claim 4 further comprising an isolation circuit connected to said amplifier for isolating said common-mode control transistors from said input transistors to limit their affect on the transconductance of said amplifier input transistors.

8. The amplifier of claim 7 wherein said isolation circuit includes:
   a third constant current source connected to a supply voltage; and
   a differential amplifier transistor pair in series with said third constant current source.

9. The amplifier of claim 4 further comprising a folding stage coupled between said second common-mode control transistor and said control node to allow a voltage at said common-mode output to be greater than a common-mode input, and to match the transconductance of said differential amplifier transistors to that of said common-mode control transistors.

10. The amplifier of claim 9 wherein said folding stage comprises:
    a third current source; and
    a transistor having a source coupled to said third current source and a source of said second common-mode transistor, said transistor having a drain connected to said control node.

11. The amplifier of claim 9 where first and second common-mode control transistors are of the same type as said differential amplifier input transistors.

* * * * *